US006754352B2

(12) United States Patent
Kanai et al.

(10) Patent No.: US 6,754,352 B2
(45) Date of Patent: Jun. 22, 2004

(54) SOUND FIELD PRODUCTION APPARATUS

(75) Inventors: Takashi Kanai, Chiba (JP); Masataka Yoritate, Tokyo (JP); Hiroshi Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 339 days.

(21) Appl. No.: 09/748,553

(22) Filed: Dec. 26, 2000

(65) Prior Publication Data

US 2002/0027995 A1 Mar. 7, 2002

(30) Foreign Application Priority Data

Dec. 27, 1999 (JP) ........................................ P11-370555

(51) Int. Cl.[7] .................................................. H03G 3/00

(52) U.S. Cl. .............................. 381/63; 381/61; 84/630

(58) Field of Search .............................. 381/61, 62, 63; 84/630, 629, 659; D19/26

(56) References Cited

U.S. PATENT DOCUMENTS 5,241,604 A * 8/1993 Noguchi ...................... 381/63
5,999,630 A * 12/1999 Iwamatsu .................... 381/63

* cited by examiner

*Primary Examiner*—Melur Ramakrishnaiah

(57) ABSTRACT

A sound-field production apparatus includes a direct-sound-generating unit for generating a direct sound from a sound signal supplied to the direct-sound-generating unit and a reflected-sound-generating unit for generating a sound serving as a substitute for a sound obtained as a result of reflection of the direct sound at a level lower than the direct sound with a timing lagging behind the direct sound from the sound signal supplied to the reflected-sound generating unit. The sound-field production apparatus makes it possible to reproduce an impressive sound field that gives a better feeling of presence on the scene as a sound field in a movie theater or the like does by creating a sound-field space having an effect of sound-image broadening.

4 Claims, 6 Drawing Sheets

SOUND FIELD PRODUCTION APPARATUS

BACKGROUND OF THE INVENTION

The present invention relates to a sound-field production apparatus. More particularly, the present invention relates to a sound-field production apparatus for reproducing a sound-field space having an effect of sound-image broadening by consideration of sounds reflected by surroundings.

An AV amplifier designed in recent years is capable of reproducing a sound field that gives a better feeling of presence on the scene at a home by virtue of signal processing carried out by a DSP (Digital Signal Processor) and by addition of actually measured reverberation characteristics of a movie theater and a theater for respective signals of typically a 5.1 channels, that is, L (left), C (center), R (right), SL (surround left) and SR (surround right) channels plus an LFE0.1 channel. Examples of such a product and an environment are an AC (Audio Coding) 3 made by Dolby Corporation and a dts (Digital Theater System) produced by DTS Corporation. Such a conventional system employs a multi-speaker output unit comprising a plurality of speakers such as the L, C, R, SR and SL speakers, and adds reflected and reverberated sounds to outputs of the speakers on the basis of measured data such as a virtual sound source distribution diagram of a movie theater being revived.

Even if reverberation characteristics obtained from measured data as described above can be reproduced with a high degree of fidelity, however, it is by no means possible to render effects of a sound field as exhibited by natural blending of sounds and pictures peculiar to a movie theater or the like. This is because, in the case of a movie theater, a front speaker is located behind a screen in an arrangement different from that of an ordinary home wherein a front speaker is located at a place in front of a monitor screen.

When a sound source generates a sound at a place in front of the listener at a distance of at least about 1 meter from the listener in an anechoic room, the listener is almost incapable of feeling separation from the sound source by a distance independently of what place the sound source is located. In an echoic room, on the other hand, the listener is capable of feeling separation from the sound source by a distance in dependence on the position of the sound source. This latter fact indicates that, in the case of a sound source separated away from a human being by a distance of at least about 1 m, the human being can be said to feel separation from a sound source by a distance due to existence of sounds reflected by a wall and/or a floor.

In an actual movie theater, a front speaker is located in a space behind a screen. A playback sound comprises a sound output by the front speaker to reach the listener through the screen and the sound reflected repeatedly by a rear wall and side walls, which exist in the rear space behind the screen, and by the screen under a variety of conditions. The reflected sound is further affected by a number of holes provided above the screen.

FIG. 6 is a diagram showing a typical screen sound-transmission characteristic of a sound screen. The screen sound-transmission characteristic was obtained as a result of a measurement by using a measurement microphone located in front of a speaker at a distance of 1.25 m with a distance from the speaker to the sound screen inserted into a location in front of the speaker set at 42 cm.

As described above, the conventional sound-field production apparatus adopts a multi-speaker system, and is capable of reproducing a sound field that gives a better feeling of presence on the scene at a home by addition of actually measured reverberation characteristics of a movie theater and a theater. Nevertheless, the conventional sound-field production apparatus has a problem of impossibility to render effects of a sound field as exhibited by natural blending of sounds and pictures peculiar to a movie theater or the like.

SUMMARY OF THE INVENTION

It is thus an object of the present invention addressing the problem described above to implement a sound-field production apparatus capable of reproducing an impressive sound field that gives a better feeling of presence on the scene as a sound field in a movie theater or the like does by creating a sound-field space having an effect of sound-image broadening through adoption of a relatively simple method.

In order to achieve the object described above, the present invention provides a sound-field production apparatus wherein some additional sounds to serve as substitutes for representatives of sounds reflected by a sound screen, a wall, a floor and the like are each generated by an auxiliary sound source at a timing lagging behind a direct sound generated by a main sound source and at a level lower than the direct sound, and the additional sounds are added to the direct sound, so as to arouse a feeling of separation of the sound source and the sound screen from the listener at apparently longer distances exceeding the actual distances to the sound sources and the sound screen.

As a result, it is possible to implement a sound-field production apparatus capable of reproducing a sound field that gives a better feeling of presence on the scene by creating a sound-field space having an effect of sound-image broadening through adoption of a relatively simple method.

PREFERRED EMBODIMENTS OF THE INVENTION

Next, some preferred embodiments each implementing a sound-field production apparatus provided by the present invention are described in detail by referring to accompanying diagrams.

Figure 1:
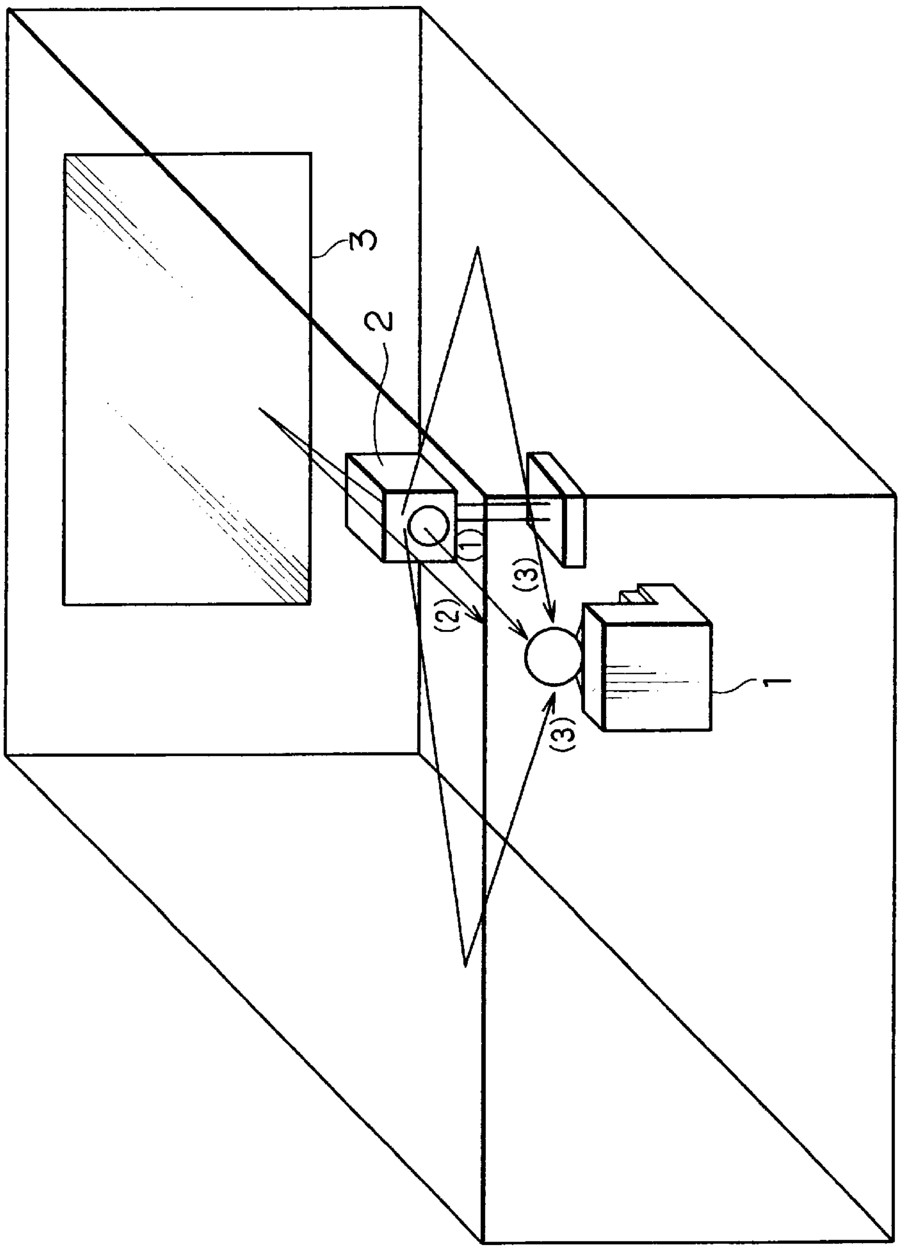
FIG. 1 is a diagram showing a typical model of a reverberant room.

Consider a model comprising a speaker (a sound-generating means) 2 placed in front of a person (listener) 1 in an echoic room as shown in FIG. 1. For the sake of simplicity, reflection of sound by the ceiling and the floor of the room is ignored. In this case, the listener 1 hears a direct sound (1) and, after the direct sound (1), a sound (2) reflected by a rear wall and sounds (3) reflected by side walls, sensing separation of a sound source from the listener by an apparently longer distance. That is to say, the listener senses separation of the speaker 2 from the listener by an apparently longer distance by totally analyzing the sounds (1), (2) and (3).

By the way, in accordance with our experiments, by merely adding the sound (2) generated after the direct sound (1) to the direct sound (1), the listener did not feel a change in distance to the speaker 2. In addition, results of the experiments also indicate that, by generating the sound (3) on at least one of the left and right sides, it is possible to arouse a feeling of separation of the speaker 2 from the listener by an apparently longer distance in the depth direction even though the results also indicate that generation of the sound (3) from both the sides results in a better effect.

Using this principle, the present invention is devised to further employ a DSP for generating sounds serving as substitutes for the reflected sounds (2) and (3) for the direct sound (1). By outputting the reflected sounds from the speaker generating the direct sound and an adjacent speaker, the devised present invention is capable of creating a multi-speaker production environment of a home theater in which the listener more strongly senses a seemingly farther position of a sound source beyond the locations of the speakers and, hence, implementing exhibition of an effect of audio-image broadening toward the screen like the effect prevailing in an actual movie theater.

In actuality, the present invention produces only a number of representative reflected sounds generated in a real movie theater, controlling delays and levels of the representative sounds in an attempt to blend sounds and images by arousing a feeling of seemingly shifted existence of the speaker to a location behind the screen in the listener like the feeling the listener has in an actual movie theater.

Figure 2:
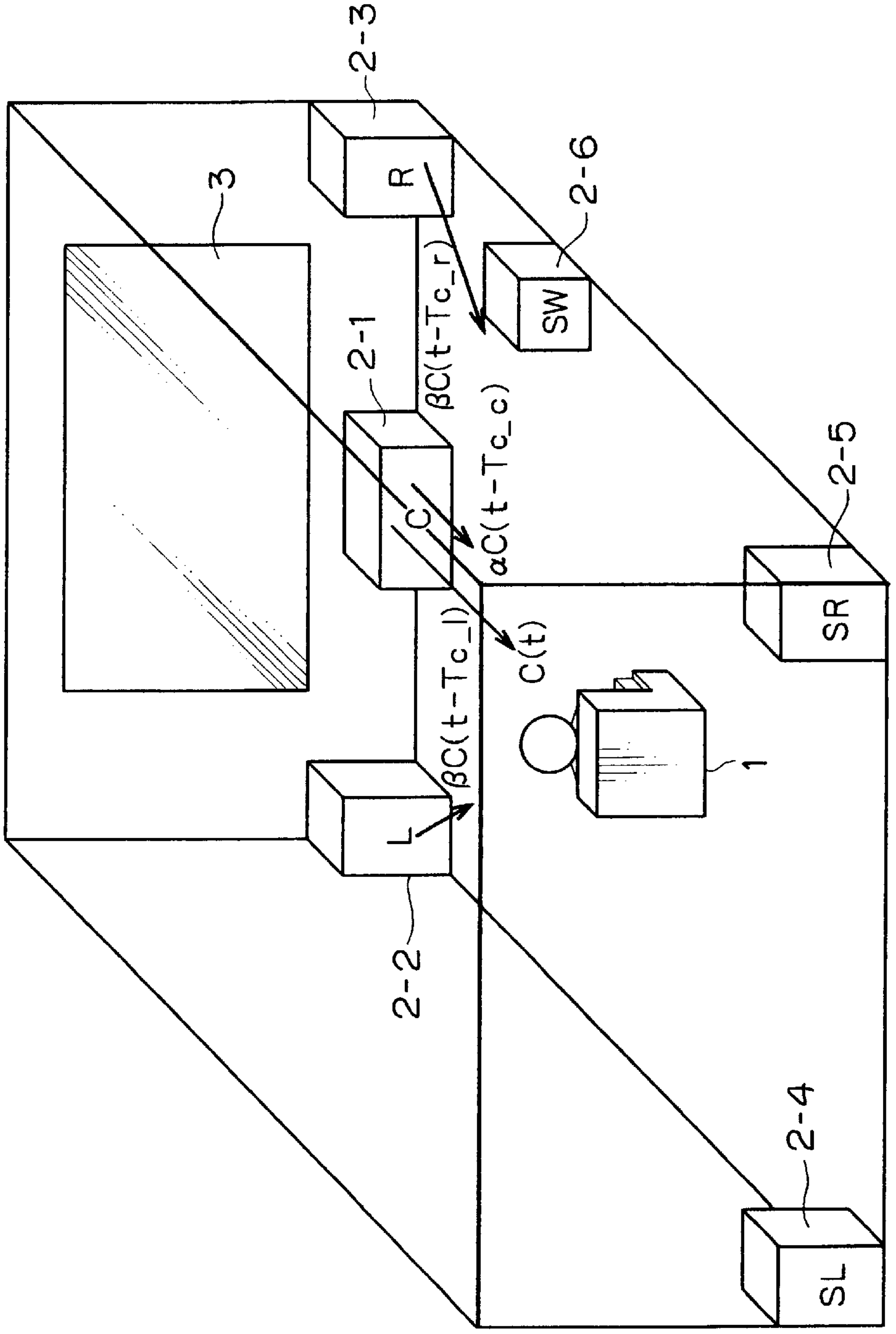
FIG. 2 is a diagram showing a model of signals generated by speakers in an embodiment of the present invention.

First of all, FIG. 2 shows a model of signals output by speakers in order to arouse a feeling of separation of a sound source from the listener by an apparently longer distance and a feeling of a seemingly farther position of the sound source in the direction toward the center speaker as implemented by an embodiment of the present invention.

In FIG. 2, reference numerals 1 and 2-1 denote a listener and a center speaker (C) respectively. Reference numeral 2—2 denotes a left speaker (L) and reference numeral 2-3 denotes a right speaker (R). Reference numerals 2-4 and 2-5 denote a surround left speaker (SL) and a surround right speaker (SR) respectively. Reference numeral 2-6 denotes a sub-woofer speaker (SW) and reference numeral 3 denotes a screen.

After the center speaker 2-1 generates an original sound C (t), the center speaker 2-1 adds a delayed original sound lagging behind the original sound C (t) by a delay time of Tc_c to the original sound C (t) in a process (1). Furthermore, the left speaker 2—2 in front of the listener and the right speaker 2-3 also in front of the listener each add a delayed original sound lagging behind the original sound C (t) by a delay time of Tc_lr to the original sound C (t) in a process (2) Thus, at a point of time t, the speakers 2-1, 2—2 and 2-3 output sound signals expressed as follows:

A sound signal output by the center speaker 2-1 is:

$$C(t)+\alpha C(t-Tc\_c) \quad (1)$$

Sound signals output by the right and left speakers 2-3 and 2—2 are:

$$\beta C(t-Tc\_lr) \quad (2)$$

where notations α and β each denote a coefficient having a value smaller than 1.

Even by carrying out the process (1) alone, it is possible to provide an effect of blurring the position of the sound source and an effect similar to that of making the listener feel separation from the sound source by an apparently longer distance.

By adoption of a method of carrying out the process (1) only, however, a unique special feeling of frequency response generated by a comb filter is aroused due to simple electrical superposition of a signal delayed from an original signal by several msec on the original signal.

In the processing (2), on the other hand, since an audio image is broadened to the left and right directions, the feeling of a seemingly farther position of a sound source from the listener can be aroused in a relatively natural way without arousing the unique special feeling of frequency response.

By properly selecting values for the delay times Tc_c and Tc_lr of the additional sound signals as well as the mix ratios α and β of the additional sound signals to the original sound signal, it is possible to arouse a feeling of a seemingly farther position of a sound source in the direction toward the center speaker.

In general, when a signal having an AC3 or dts format is played back by using an AV amplifier in many cases, the reproduced sounds are output by a multi-channel speaker system implemented by an actual layout of speakers including a center speaker (C), a left speaker (L), a right speaker (R), a surround left speaker (SL), a surround right speaker (SR) and a sub-woofer speaker (SW). Thus, in order to arouse a feeling of a seemingly farther position of a sound source in the directions toward front speakers (C), (L) and (R), it is necessary to carry out processing not only on a signal to be generated by the center speaker (C), but also on signals to be output by the speakers (L) and (R) on the left and right sides respectively.

Figure 3:
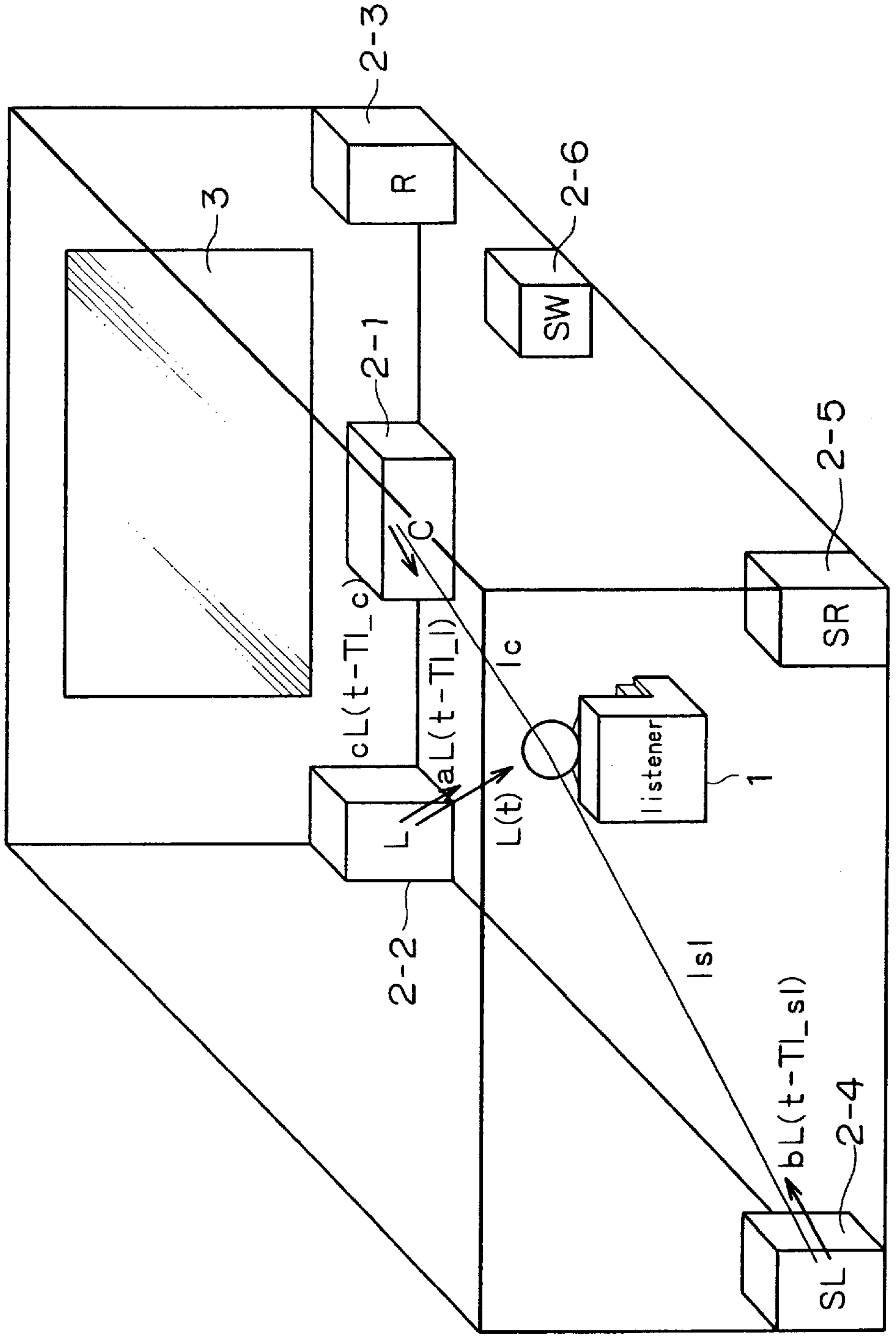
FIG. 3 is a diagram showing a model of signals generated by speakers in another embodiment of the present invention.

FIG. 3 is a model diagram showing signals output by the center speaker (C), the left speaker (L) and the surround left speaker (SL) in order to arouse a feeling of a seemingly farther position of a sound source in the direction to the left speaker L.

Components of FIG. 3 identical with those shown in FIG. 2 are denoted by the same reference numerals as the latter. That is to say, reference numerals 1 and 2-1 denote a listener and a center speaker (C) respectively. Reference numeral 2—2 denotes a left speaker (L) and reference numeral 2-3 denotes a right speaker (R). Reference numerals 2-4 and 2-5 denote a surround left speaker (SL) and a surround right speaker (SR) respectively. Reference numeral 2-6 denotes a sub-woofer speaker (SW) and reference numeral 3 denotes a screen.

First of all, after the left speaker 2—2 generates an original sound, the left speaker 2—2 adds a delayed signal of the original sound lagging behind the original sound by a delay time of Tl_l to the original sound in a process corresponding to the process (1). Then, a next process corresponding to the process (2) is carried out. In this next process, the surround left speaker 2-4 adjacent to the left speaker 2—2 and the center speaker 2-1 also adjacent to the left speaker 2—2 each add a delayed original sound to the original sound as the left speaker 2—2 at a location adjacent to the center speaker 2-1 in front of the listener and the right speaker 2-3 also at a location adjacent to the center speaker 2-1 in front of the listener each add a delayed original sound of the center speaker 2-1 to the original sound of the center speaker 2-1 in the process (2).

Let notation L (t) denote the original sound generated by the left speaker 2—2 and notation Tl_sl denote a delay time by which the signal generated by the surround left speaker 2-4 lags behind the original sound L (t) in the next process. By the same token, let notation Tl_c denote a delay time by which the signal generated by the center speaker 2-1 lags behind the original sound L (t) in the next process. In this case:

A sound signal output by the left speaker 2—2 is:

$$L(t)+aL(t-Tl\_l) \quad (3)$$

A sound signal output by the surround left speaker 2-3 is:

$$bL(t-Tl\_sl) \quad (4)$$

A sound signal output by the center speaker 2-1 is:

$$cL(t-Tl\_c) \quad (5)$$

where notations a, b and c each denote a coefficient having a value smaller than 1.

In general, the distance between the listener 1 and the surround left speaker 2-4 is different from the distance between the listener and the center speaker 2-1. It is thus necessary to set the delay times of the signals output by the surround left speaker 2-4 and the center speaker 2-1 at such values that the listener is brought to a sound-field environment as if each of the delayed signals output by the surround left speaker 2-4 and the center speaker 2-1 were obtained as a result of reflection of the original signal generated by the left speaker 2—2. That is to say, for lsl>lc, $$Tl\_sl>Tl\_c \quad (6)$$

and/or $$b<c \quad (7)$$

where notation lsl denote the distance between the listener and the surround left speaker 2-4 whereas notation lc the distance between the listener and the center speaker 2-1. By setting the delay times or the levels of the signals output by the surround left speaker 2-4 and the center speaker 2-1 at proper values, it is possible to experimentally verify that the listener is brought to a sound-field environment as if each of the delayed signals output by the surround left speaker 2-4 and the center speaker 2-1 were obtained as a result of reflection of the original signal generated by the left speaker 2—2.

The same processing is carried out also for the right speaker 2-3. By carrying out such pieces of processing, it is possible to uniformly arouse feeling of a seemingly farther positions of sound sources not only in the direction to the center speaker 2-1 but also in the directions to the left and right speakers 2—2 and 2-3. The degree of feeling of a seemingly farther position of a sound source can be controlled by adjusting the delay times and the levels of a variety of signals to be added.

Since the effect of arousing a feeling of a seemingly farther position of a sound source varies also in dependence on the amount of reverberation existing in the room, coefficients effective for a variety of environments are studied in advance. Then, it is nice to provide a sound-field production apparatus with a function for selecting a set of parameters matching the environment of the listener's own room.

When the feeling of a seemingly farther position of a sound source in the front directions is increased by adoption of the method described above, however, the listener feels as if the sound from each rear direction were generated by a source provided at a relatively close location. As a result, the balance of magnitudes of sounds coming from the front and rear directions becomes poor in some cases. In order to solve this problem, the same processing as the front directions is carried out for the rear directions.

To put it in detail, the left speaker 2—2 and the surround right speaker 2-5 are adjacent to the surround left speaker 2-4. By the same token, the right speaker 23 and the surround left speaker 2-4 are adjacent to the surround right speaker 2-5. Thus, after the surround left speaker 2-4 generates a signal SL, a delayed signal SL lagging the signal SL by the delay time Tsl_sl is again generated by the surround left speaker 2-4 and added to the signal SL originally generated by the surround left speaker 2-4. In the same way, a delayed signal SL lagging the signal SL by the delay time Tsl_l is generated by the left speaker 2—2 and added to the signal SL. By the same token, a delayed signal SL lagging the signal SL by the delay time Tsl_sr is generated by the surround right speaker 2-5 and added to the signal SL.

The above processing is carried out similarly also for the surround right speaker 2-5.

Figure 4:
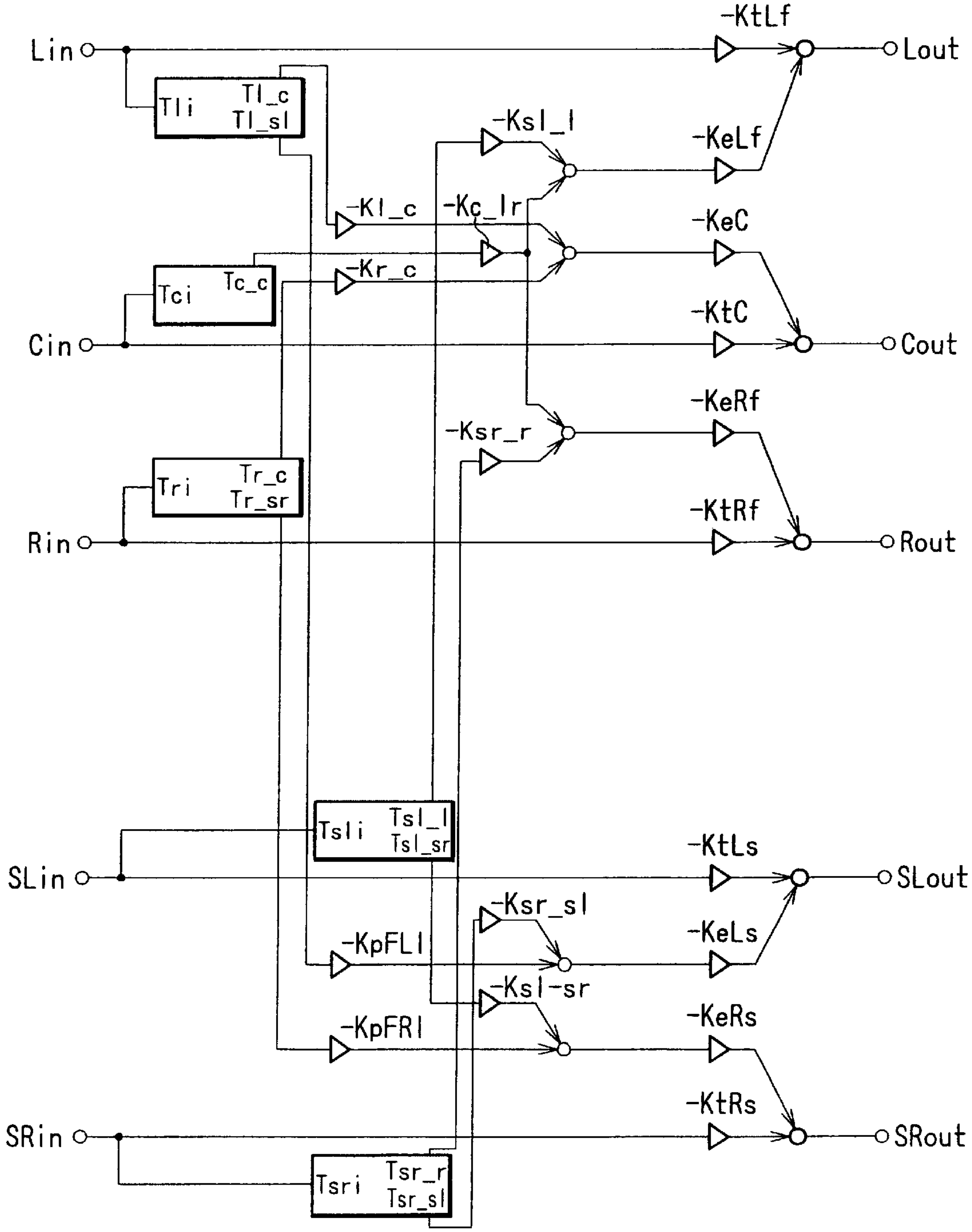
FIG. 4 is a block diagram showing signal processing actually carried out in an embodiment of the present invention.

FIG. 4 is a block diagram showing signal processing actually carried out by a DSP mounted on the sound-field production apparatus in accordance with the method described above. Blocks shown in the diagram are a delay circuit, a coefficient-multiplying circuit and an adder. In this embodiment, a delayed signal is not added to a signal generated by the center speaker (C), the left speaker (L), the right speaker (R), the surround left speaker (SL), or the surround right speaker (SR). This is because an emphasis is placed on production of a natural feeling of a seemingly farther position of a sound source without changing a tone color in the implementation of the actual audio-field production apparatus. It is needless to say that the delayed signal can also be added to the signal of each channel.

Figure 5:
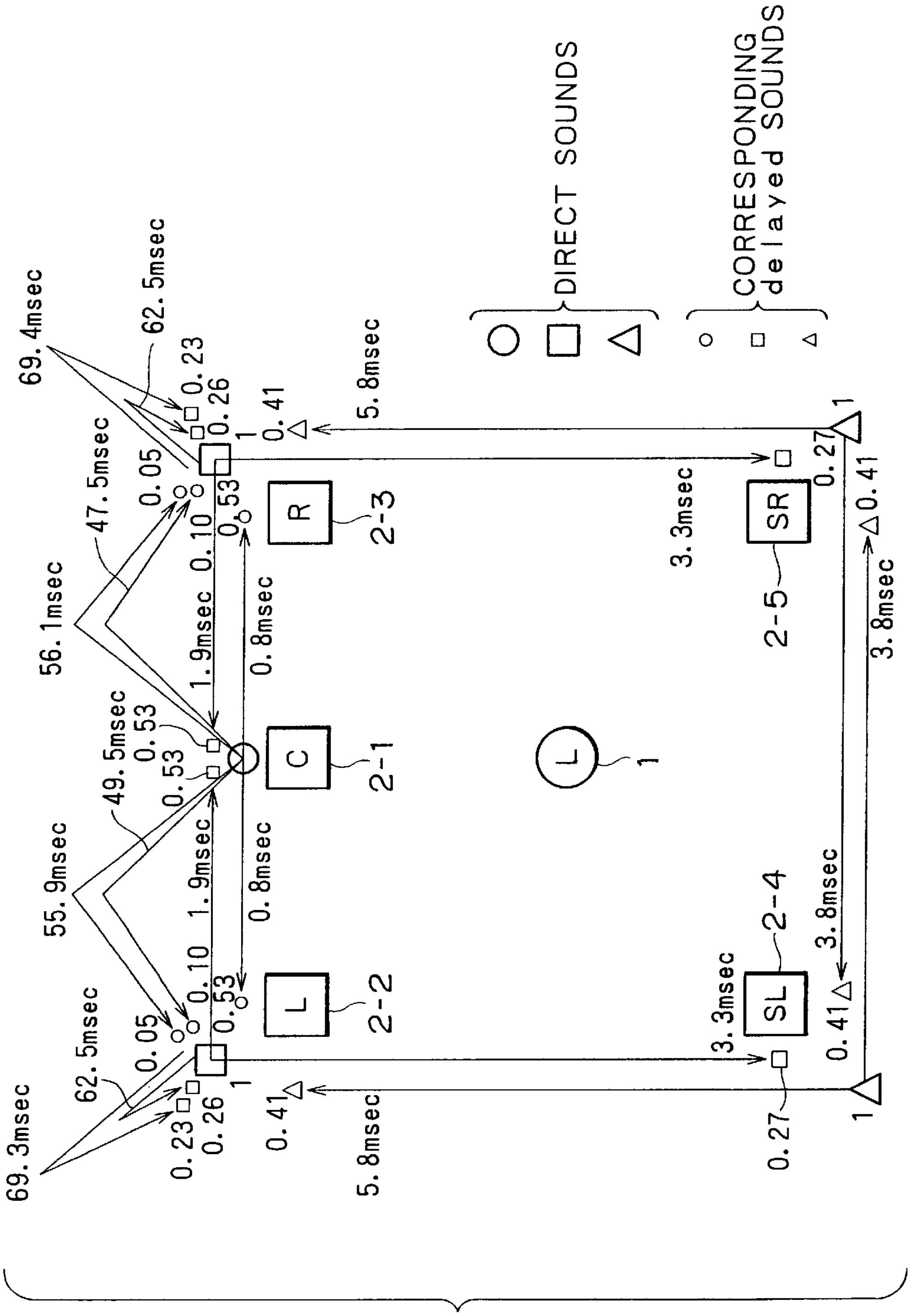
FIG. 5 is a model diagram showing delay times and levels of signals in an embodiment of the present invention operating in one of modes to arouse a feeling of a seemingly farther position of a sound source.
Figure 6:
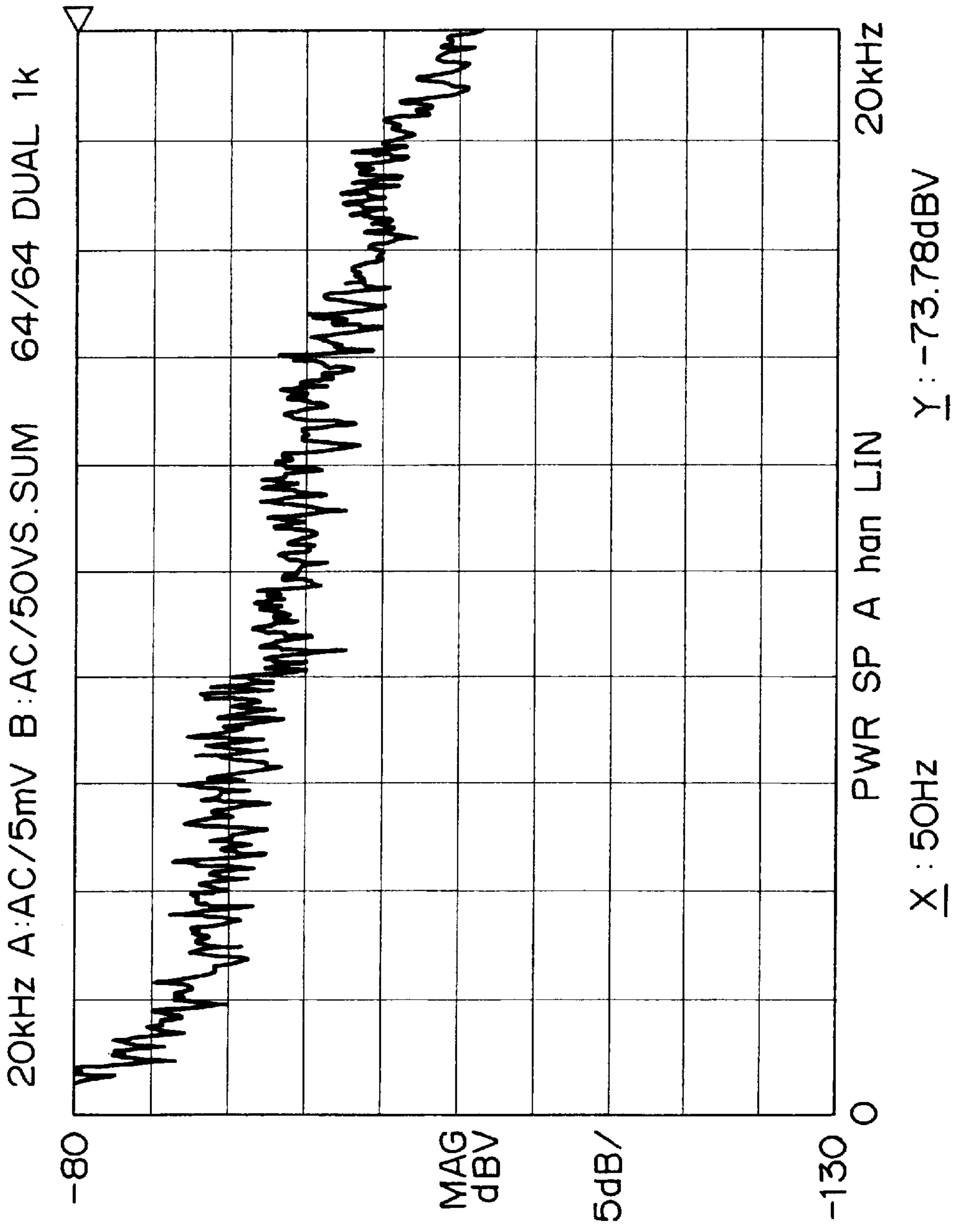
FIG. 6 is a diagram showing a sound transmission characteristic of a sound screen.

FIG. 5 is a model diagram showing delay times and levels of signals in an actual sound-field production apparatus operating in one of modes to arouse a feeling of a seemingly farther position of a sound source. In this embodiment, in addition to the processing described above, for the center speaker (C), the left speaker (L) and the right speaker (R) located in front of the listener, ordinary processing is carried out to add a signal reflected by the left speaker (L) to a signal generated by the left speaker (L), a signal reflected by the right speaker (R) to a signal generated by the right speaker (R) and a signal reflected by the center speaker (C) to the signal generated by the left speaker (L) and the signal generated by the right speaker (R) in order to further increase the feeling of a seemingly farther position of a sound source in the front direction. Since the additions of the reflected signals of high levels at delay times of tens of msec described above cause separations of sounds, however, it is desirable to select proper levels.

As described above, according to the present invention, there is provided a sound-field production apparatus including a direct-sound-generating means for generating a direct sound from a sound signal supplied to the direct-sound-generating means, and a reflected-sound-generating means for generating a sound serving as a substitute for a sound obtained as a result of reflection of the direct sound at a level lower than the direct sound with a timing lagging behind the direct sound from the sound signal supplied to the reflected-sound-generating means.

Thus, in addition to the conventional reverberation, the produced sound field exhibits an effect of broadening an audio image toward a space behind a display or monitor screen almost resembling an effect aimed at by a movie producer in production of a movie. As a result, it is possible to produce an impressive and real sound field like that produced in a movie theater.

Furthermore, in accordance with the present invention, in addition to a first speaker for outputting the direct sound, there is also provided a second speaker for outputting a sound serving as a substitute for a sound obtained as a result of reflection of the direct sound from a signal obtained as a result of processing carried out by a signal-delaying means and a level-adjusting means. It is thus possible to arouse a feeling of a seemingly farther position of a sound source in a direction toward the first speaker and to produce a real sound field like that produced in a movie theater.

In addition, in accordance with the present invention, a sound serving as a substitute for a sound obtained from a place behind the listener as a result of reflection of the direct sound generated by the first speaker is also added to the direct signal to arouse an even stronger feeling of a seemingly farther position of a sound source in a direction toward the first speaker.

Moreover, in accordance with the present invention, a sound signal obtained as a result of processing carried out by a signal-delaying means and a level-adjusting means is supplied to a pair of mutually adjacent second speakers sandwiching the first speaker for generating the direct sound. As a result, a natural feeling of a seemingly farther position of a sound source in a direction to the first speaker can be aroused without causing a unique special feeling of frequency response, making it possible to produce a real sound field like that produced in a movie theater.

What is claimed is:

1. A sound-field production apparatus comprising:

direct-sound-generating means for generating a direct sound from a sound signal supplied to said direct-sound-generating means; and reflected-sound-generating means for generating a sound serving as a substitute for a sound obtained as a result of reflection of said direct sound at a level lower than said direct sound with a timing lagging behind said direct sound from said sound signal supplied to said reflected-sound generating means, wherein said direct-sound-generating means includes a first speaker; and said reflected-sound-generating means includes:

a pair of second speakers arranged at both sides of said first speaker;

a pair of signal-delaying means each used for delaying said sound signal supplied to any one of said second speakers; and a pair of level-adjusting means each used for adjusting the level of said sound signal supplied to any one of said second speakers, and wherein for a distance from a listener to one of said second speakers different from a distance from said listener to the other second speaker, a delay time of said sound signal supplied to said second speaker farther from said listener is made longer than a delay time of said sound signal supplied to said second speaker closer to said listener, and the level of said sound signal supplied to said second speaker farther from said listener is made lower than the level of said sound signal supplied to said second speaker closer to said listener.

2. The sound-field production apparatus according to claim 1, said apparatus further comprising:

a second signal-delaying means for delaying said sound signal;

a second level-adjusting means for adjusting the level of said sound signal; and a signal-mixing means for mixing a signal obtained as a result of processing carried out by said second signal-delaying means and said second level-adjusting means with said sound signal to produce a mixed signal supplied to said first speaker.

3. The sound-field production apparatus according to claim 1 wherein:

said first speaker is a center speaker located at a place rightly in front of a listener;

one of said second speakers is a left channel speaker located at a place in front of said listener on the left side; and the other second speaker is a right channel speaker located at a place in front of said listener on the right side.

4. The sound-field production apparatus according to claim 1 wherein:

said first speaker is a left channel speaker located at a place in front of a listener on the left side or a right channel speaker located at a place in front of said listener on the right side;

one of said second speakers is a center speaker located at a place rightly in front of said listener; and the other second speaker is a rear left channel speaker located at a place behind said listener on the left side or a rear right channel speaker located at a place behind said listener on the right side.

* * * * *